(12) United States Patent
Lee et al.

(10) Patent No.: US 7,885,115 B2
(45) Date of Patent: Feb. 8, 2011

(54) NON-VOLATILE MEMORY DEVICES AND METHODS OF OPERATING NON-VOLATILE MEMORY DEVICES

(75) Inventors: Tae-hee Lee, Yongin-si (KR); Won-joo Kim, Hwaseong-si (KR); June-mo Koo, Seoul (KR); Tae-eung Yoon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 203 days.

(21) Appl. No.: 12/318,651

(22) Filed: Jan. 5, 2009

(65) Prior Publication Data

US 2009/0285027 A1      Nov. 19, 2009

(30) Foreign Application Priority Data

May 15, 2008    (KR) .................... 10-2008-0045060

(51) Int. Cl.
   *G11C 11/34*        (2006.01)
(52) U.S. Cl. .................. 365/185.17; 365/195
(58) Field of Classification Search ............ 365/185.17, 365/195
   See application file for complete search history.

(56) References Cited

U.S. PATENT DOCUMENTS 7,525,841 B2 *   4/2009   Aritome ................ 365/185.17

* cited by examiner

*Primary Examiner*—Son Dinh
*Assistant Examiner*—Nam Nguyen
(74) *Attorney, Agent, or Firm*—Harness, Dickey and Pierce, P.L.C.

(57) ABSTRACT

A non-volatile memory device, which includes a plurality of memory transistors that are coupled with a plurality of bit lines and a plurality of word lines, and methods of operating a non-volatile memory device are provided. A selected bit line for programming and unselected bit lines for preventing programming are determined from the plurality of bit lines. An inhibiting voltage is applied to at least one inhibiting word line chosen from the plurality of word lines. The at least one inhibiting word line includes a word line positioned closest to a string selection line. A programming voltage is applied to a selected word line chosen from the plurality of word lines. Data is programmed into a memory transistor coupled with the selected word line and the selected bit line while preventing data from being programming into memory transistors coupled with the unselected bit line.

20 Claims, 12 Drawing Sheets

NON-VOLATILE MEMORY DEVICES AND METHODS OF OPERATING NON-VOLATILE MEMORY DEVICES

PRIORITY STATEMENT

This application claims the benefit of priority under 35 U.S.C. §119 from Korean Patent Application No. 10-2008-0045060, filed on May 15, 2008, in the Korean Intellectual Property Office, the disclosure of which is incorporated herein in its entirety by reference.

BACKGROUND

1. Field

Example embodiments relate to a semiconductor device. Other example embodiments relate to a non-volatile memory device and methods of operating a non-volatile memory device.

2. Description of the Related Art

NAND-type non-volatile memory devices may include memory transistors that are coupled with word lines and bit lines. In order to perform selective programming on the aforementioned NAND-type non-volatile memory devices, data needs to be programmed to a memory transistor on a selected bit line, and the programming of data to memory transistors on unselected bit lines needs to be prevented.

For example, a technique of preventing data from being programmed to some NAND strings according to a channel boosting technique is known in the conventional art. According to the channel boosting technique, a program potential to be applied to memory transistors on unselected bit lines is lowered by inducing a high channel-boosting voltage to a channel of the unselected bit lines, preventing data from being programmed to the memory transistors on the unselected bit lines.

However, a channel boosting voltage damages the memory transistors existing at the outermost sides of a non-volatile memory device, leading to a degradation in the operational reliability of the non-volatile memory device. For example, hot carriers generated due to a gate induced drain leakage (GIDL) may disturb the memory transistors. Thus, the programs and pass windows of the memory transistors decrease, and a short-channel effect may be generated during the reading of data from the memory transistors.

SUMMARY

Example embodiments relate to a semiconductor device. Other example embodiments relate to a non-volatile memory device and methods of operating a non-volatile memory device.

According to example embodiments, there is provided a method of operating a NAND-type non-volatile memory device. The NAND-type non-volatile memory device may include a plurality of memory transistors, which are coupled with a plurality of bit lines and a plurality of word lines. A selected bit line for programming and unselected bit lines for preventing programming are determined (or selected) from among the plurality of bit lines. An inhibiting voltage is applied to at least one inhibiting word line including a word line closest (nearest) to a string selection line. The at least one inhibiting word line is selected from among the plurality of word lines. A programming voltage is applied to a selected word line. The programming voltage is selected from among the plurality of word lines. Data may be programmed into a memory transistor (selected from among the plurality of memory transistors) coupled with the selected word line and the selected bit line while preventing data from being programming into memory transistors (selected from among the plurality of memory transistors) coupled with the unselected bit line.

If the inhibiting voltage has been applied to the at least one inhibiting word line, an operating voltage that is less than, or equal to, the inhibiting voltage may be applied to the string selection line.

The operating voltage may be applied to the unselected bit lines simultaneously, or after, applying the inhibiting voltage to the at least one inhibiting word line.

Prior to applying the programming voltage to the selected word line, 0V may be applied to the selected bit line.

A pass voltage may be applied to unselected word lines including word lines between the string selection line and the selected word line from among the plurality of word lines, simultaneously as applying the programming voltage to the selected word line.

The at least one inhibiting word line may be identical with the selected word line. The inhibiting voltage and the programming voltage may be sequentially applied to the selected word line.

The at least one inhibiting word line may be different from the selected word line. The method may include applying a pass voltage to the at least one inhibiting word line, after the inhibiting voltage is applied to the at least one inhibiting word line.

In the programming, memory transistors coupled with the selected bit line may be electrically connected to each another by an electrical field effect source/drain induced by a fringe field.

The at least one inhibiting word line may include at least one word line adjacent to the word line closest to the string selection line from among the plurality of word lines.

According to example embodiments, there is provided a method of operating a NAND-type non-volatile memory device. The NAND-type non-volatile memory device may include a plurality of memory transistors that are coupled with a plurality of bit lines and a plurality of word lines. In this method, a selected bit line for programming and unselected bit lines for preventing programming are determined from among the plurality of bit lines. A voltage of 0V may be applied to a string selection line and a ground selection line disposed on opposite sides of the plurality of word lines. An inhibiting voltage may be applied to an inhibiting word line including a word line closest (or nearest) to the string selection line from among the plurality of word lines. An operating voltage less than, or equal to, the inhibiting voltage may be applied to the string selection line and the unselected bit lines. A programming voltage may be applied to a selected word line from among the plurality of word lines. A pass voltage may be applied to unselected word lines including word lines between the string selection line and the selected word line from among the plurality of word lines.

BRIEF DESCRIPTION OF THE DRAWINGS

Example embodiments will be more clearly understood from the following detailed description taken in conjunction with the accompanying drawings.

FIG. 1 is a circuit diagram of a non-volatile memory device according to example embodiments;

FIG. 2 is a plan view of the non-volatile memory device illustrated in FIG. 1;

FIG. 3 is a cross-sectional view of the non-volatile memory device shown in FIG. 2 taken along line a'-a" of a bit line;

FIG. 4 is a circuit diagram for describing an operation of programming data to the non-volatile memory device illustrated in FIG. 2;

FIG. 5 is a partially magnified cross-sectional view for describing the operation of programming data to the non-volatile memory device illustrated in FIG. 3;

FIG. 6 is a circuit diagram for describing an operation of preventing data from being programmed to the non-volatile memory device illustrated in FIG. 3;

FIG. 7 is a graph for describing the operation of preventing data from being programmed to the non-volatile memory device illustrated in FIG. 3;

FIG. 8 is a circuit diagram of a non-volatile memory device according to example embodiments; and FIGS. 9-15 are timing diagrams for describing various methods of operating the non-volatile memory device of FIG. 8 according to example embodiments

DETAILED DESCRIPTION OF EXAMPLE EMBODIMENT

Figure 1:
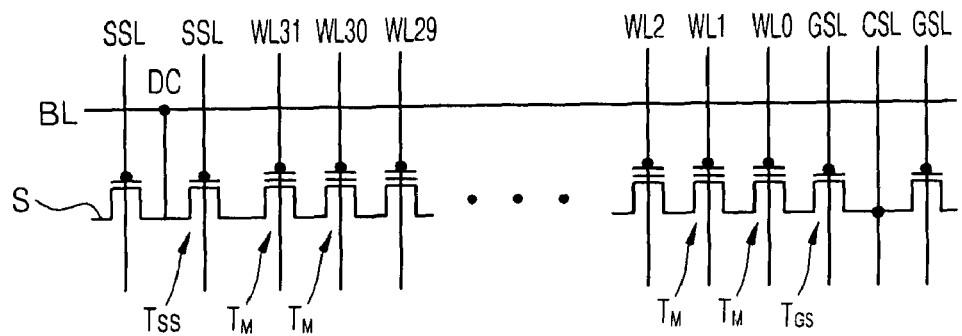
FIGS. 1-15 represent non-limiting, example embodiments as described herein.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to a semiconductor device. Other example embodiments relate to a non-volatile memory device and methods of operating a non-volatile memory device.

FIG. 1 is a circuit diagram of a non-volatile memory device according to example embodiments.

Referring to FIG. 1, the non-volatile memory device may have a NAND-type structure. A plurality of memory transistors $T_M$ may be coupled with a bit line BL and a plurality of word lines WL0, WL1, WL2 . . . WL29, WL30, and WL31.

The plurality of memory transistor $T_M$ may be arranged within a NAND string S. A string selection transistor $T_{SS}$ and a ground selection transistor $T_{GS}$ may be arranged opposite to each other. The memory transistors $T_M$ may be arranged between the string selection transistor $T_{SS}$ and the ground selection transistor $T_{GS}$. The string selection transistor $T_{SS}$, the memory transistors $T_M$, and the ground selection transistor $T_{GS}$ may be sequentially connected to each other in series.

The bit line BL may be disposed (or extend) in the same direction in which the NAND string S extends. The bit line BL may be connected to a portion of the NAND string S that is on the opposing side of the string selection transistor $T_{SS}$ in relation to the memory transistors $T_M$. For example, the bit line BL may be connected to the NAND string S via a contact plug DC.

The word lines WL0, WL1, WL2 ... WL29, WL30, and WL31 may be electrically connected to control gate electrodes (shown in FIG. 2) of the memory transistors $T_M$ so as to be coupled with the memory transistors $T_M$. The number of memory transistors $T_M$ and the number of word lines WL0, WL1, WL2 ... WL29, WL30, and WL31 are shown in FIG. 1 may vary according to the capacity of the non-volatile memory device.

A string selection line SSL and a ground selection line GSL may be arranged on opposite sides, respectively, of the group of word lines WL0, WL1, WL2 ... WL29, WL30, and WL31. The string selection line SSL may be connected to a gate electrode of the string selection transistor $T_{SS}$. The ground selection line GSL may be connected to a gate electrode of the ground selection transistor $T_{GS}$. A common source line CSL may be electrically connected to a portion of the NAND string S, which is on an opposing side the ground selection transistor $T_{GS}$ in relation to the memory transistors $T_M$.

Figure 2:
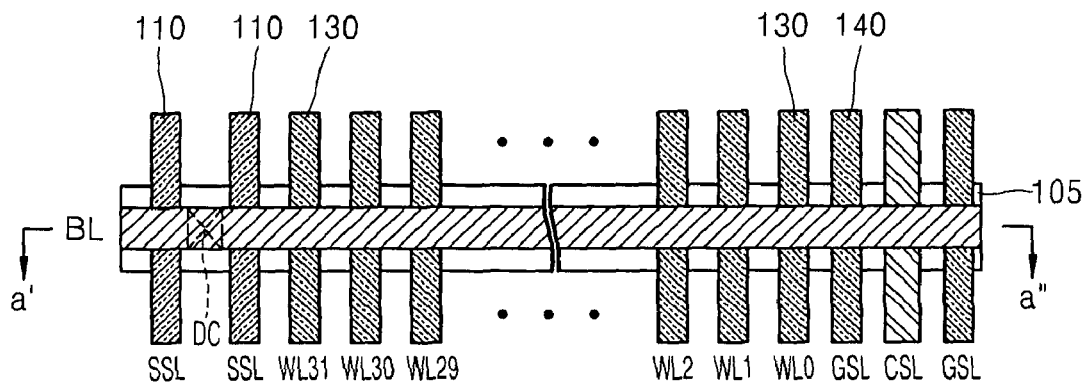
Figure 3:
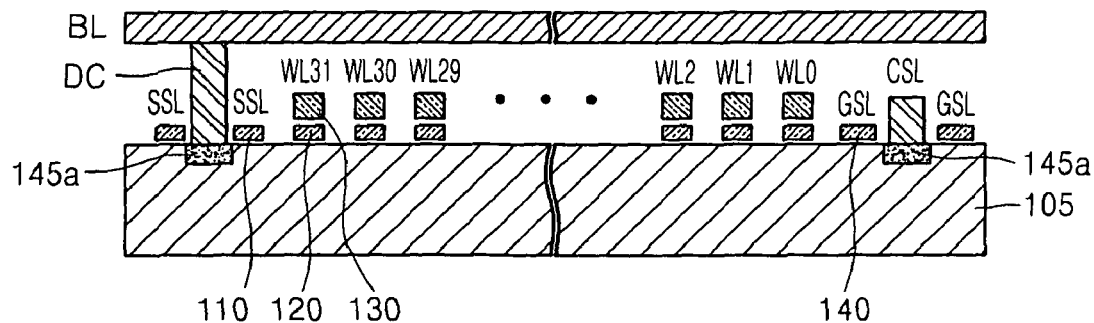

FIG. 2 is a plan view of the non-volatile memory device illustrated in FIG. 1. FIG. 3 is a cross-sectional view of the non-volatile memory device illustrated in FIG. 2 taken along line a1'-a" of the bit line BL. The structures of FIGS. 2 and 3 correspond to the circuit diagram of FIG. 1.

Referring to FIGS. 2 and 3, the NAND string S of FIG. 1 may correspond to a semiconductor substrate 105. For example, a portion of the semiconductor substrate 105 may provide a charge-conducting path. The semiconductor substrate 105 may include a semiconducting material (e.g., silicon, germanium or silicon-germanium). In FIGS. 1-3, an active region is illustrated as the semiconductor substrate 105. As such, an isolation film (not shown) may be disposed around the active region.

The memory transistors $T_M$ may include stacks of control gate electrodes 130 and charge storage layers 120 sequentially formed on the semiconductor substrate 105. For example, the control gate electrodes 130 may be isolated from the charge storage layers 120 by a blocking insulation layer (not shown) formed on the charge storage layers 120. The charge storage layers 120 may be floating gate layers or charge trapping layers. A tunneling insulation layer (not shown) may be interposed between the semiconductor substrate 105 and the charge storage layers 120. The control gate electrodes 130 may be used as parts of the word lines WL0, WL1, WL2 ... WL29, WL30, and WL31.

The string selection transistor $T_{SS}$ of FIG. 1 may include a first gate electrode 110 on the semiconductor substrate 105. The first gate electrode 110 may be used as a part of the string selection line SSL. The ground selection transistor $T_{GS}$ of FIG. 1 may include a second gate electrode 140 on the semiconductor substrate 105. The second gate electrode 140 may be used as a part of the ground selection line GSL. For example, the string selection transistor $T_{SS}$ and the ground selection transistor $T_{GS}$ may have MOS transistor structures.

The bit line BL may be connected to a first source/drain region 145a that is on a side of the first gate electrode 110 opposite to the memory transistors $T_M$. The bit line BL may be connected to the first source/drain region 145a via the contact plug DC. The common source line CSL may be electrically connected to another first source/drain region 145a that is on a side of the second gate electrode 140 opposite to the memory transistors $T_M$.

The first source/drain regions 145a may be formed by doping the semiconductor substrate 105 with impurities. For example, if the semiconductor substrate 105 is a first conductive type, the first source/drain regions 145a may be doped with second conductive impurities. As such, the first source/drain regions 145a may form a diode junction with the semiconductor substrate 105.

In example embodiments, the first source/drain regions 145a may be defined in portions of the semiconductor substrate 105, which are on sides of the first gate electrode 110 and the second gate electrode 140 opposite to the memory transistors $T_M$. The first source/drain regions 145a may not be defined in portions of the semiconductor substrate 105 that are between adjacent control gate electrodes 130, between the control gate electrodes 130 and the first gate electrode 110, and between each of the control gate electrodes 130 and the second gate electrode 140.

As described above, as the first source/drain regions 145a are locally defined, the control gate electrodes 130 may be closely arranged. As such, the integration of the non-volatile memory device may increase. For example, a cross-section of the non-volatile memory device of FIG. 3 may be about 47% smaller than that of a typical (or conventional) NAND-type non-volatile memory device.

A method of operating the non-volatile memory device illustrated in FIG. 1 will now be described with reference to FIGS. 4 through 7.

Figure 4:
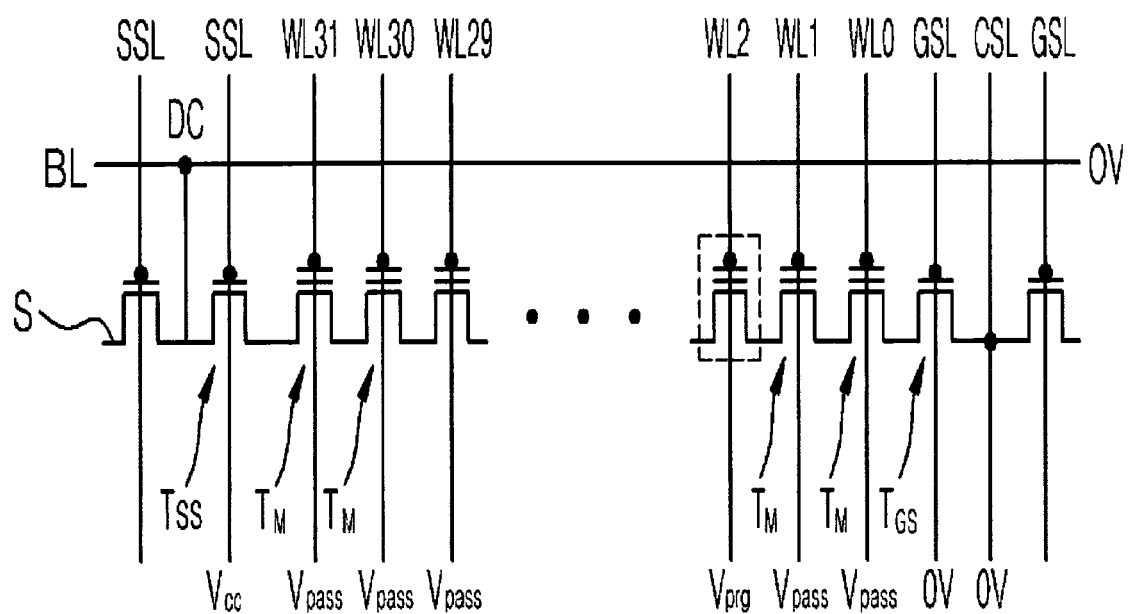
Figure 5:
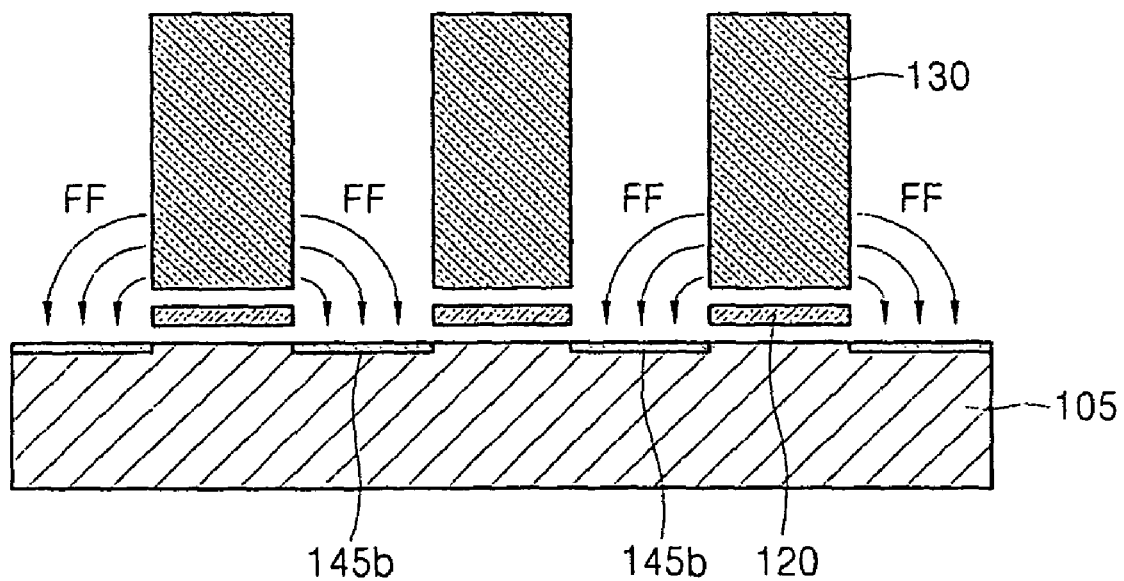

Referring to FIGS. 4 and 5, a method of programming data to the memory transistor $T_M$ coupled to the word line WL2, which is selected to perform programming, will now be illustrated. A voltage of 0V may be applied to the bit line BL, the ground selection line GSL and the common source line CSL. An operating voltage $V_{CC}$ may be applied to the string selection line SSL. A programming voltage $V_{prg}$ may be applied to the selected word line WL2. A pass voltage $V_{pass}$ may be applied to the word lines WL0, WL1, WL3, ... WL29, WL30, and WL31 other than the selected word line WL2.

As illustrated in FIG. 5, under the aforementioned programming operation conditions, second source/drain regions 145b may be induced in portions of the semiconductor substrate 105, which are between adjacent control gate electrodes 130. The second source/drain regions 145b may be induced by a fringe field (FF) formed by a voltage that is applied to the control gate electrodes 130. The second source/drain regions 145b are inversion layers formed by an electric field effect. As such, the second source/drain regions 145b may be similar to channels.

The second source/drain regions 145b may be induced only if a voltage has been applied to the control gate electrodes 130. In this regard, the second source/drain regions 145b induced by the electric field effect may be distinguishable from the first source/drain regions 145a formed by impurity doping.

The second source/drain regions 145b may also be formed in a portion of the semiconductor substrate 105 that exists between the first gate electrode 110 and a control gate electrode 130 adjacent to the first gate electrode 10, and a portion of the semiconductor substrate 105 which exists between the second gate electrode 140 and a control gate electrode 130 adjacent to the second gate electrode 140. The second source/drain regions 145b may be charge-conducting paths during the programming of data to the non-volatile memory device.

Under the aforementioned programming conditions, the semiconductor substrate 105 may be provided with electrons. The electrons may be injected into the memory transistor $T_M$ coupled with the word line WL2 to which the programming voltage $V_{prg}$ is applied.

Figure 6:
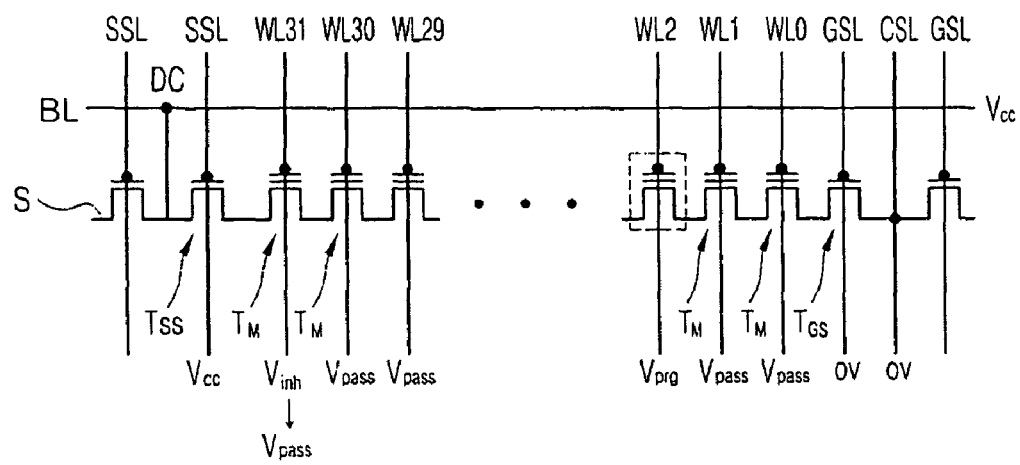
Figure 7:
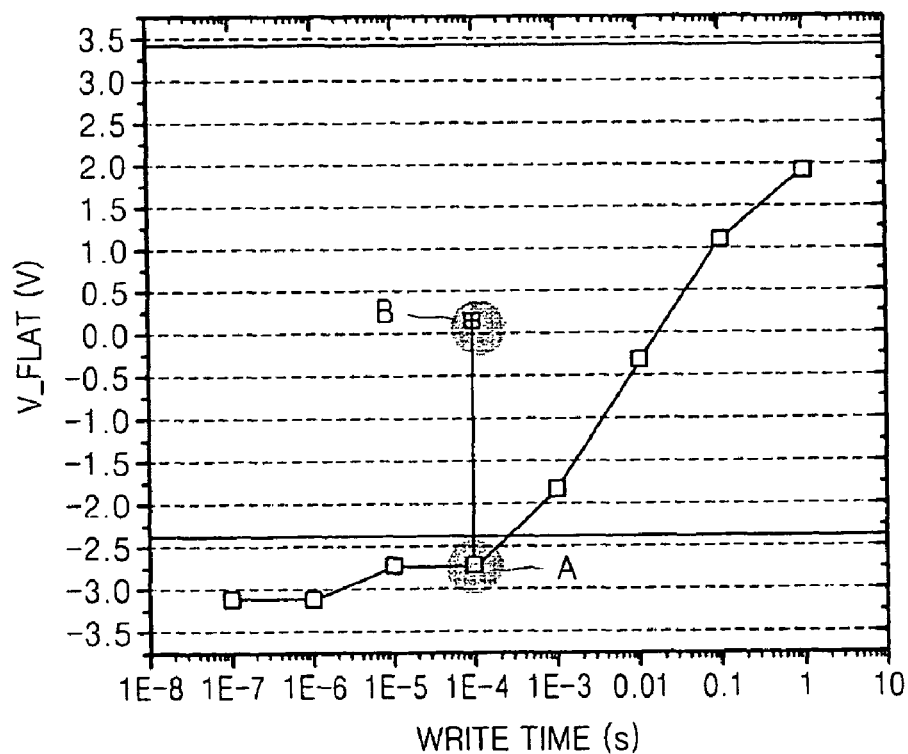

Referring to FIGS. 6 and 7, a method of preventing data from being programmed to the memory transistors $T_M$ coupled with the bit line BL will be described. A voltage of 0V may be applied to the ground selection line GSL and the common source line CSL. The operating voltage $V_{CC}$ may be applied to the bit line BL and the string selection line SSL. The programming voltage $V_{prg}$ may be applied to the selected word line WL2. The pass voltage $V_{pass}$ may be applied to word lines WL0, WL1, WL3, . . . WL29, WL30, and WL31 other than the selected word line WL2.

An inhibiting voltage $V_{inh}$ may be applied to the word line WL31, which is closest (or nearest) to the string selection line SSL prior to applying the pass voltage $V_{pass}$ to the word line WL31. The word line WL31 may be referred to as an inhibiting word line. The inhibiting word line includes the word line WL31. The inhibiting word line may also include one or more word lines adjacent to the word line WL31.

The inhibiting voltage $V_{inh}$ may be applied to the string selection line SSL prior to applying the operating voltage $V_{CC}$ to the string selection line SSL. The inhibiting voltage $V_{inh}$ may increase the potential of a portion of the semiconductor substrate 105 that is around the string selection transistor $T_{SS}$. The inhibiting voltage $V_{inh}$ is greater than, or equal to, the operating voltage $V_{CC}$. If the operating voltage $V_{CC}$ is applied to the string selection line SSL to which the inhibiting voltage $V_{inh}$ has been applied, the string selection transistor $T_{SS}$ may be turned off. As such, the memory transistors $T_M$ and the bit line BL may be disconnected from each other. If the memory transistors $T_M$ and the bit line BL are disconnected from each other, the supply of electrons into the memory transistors $T_M$ may be interrupted.

In a method of operating the non-volatile memory device according to an incremental step pulse program (ISPP) technique, it may difficult for the inversion-type second source/drain regions 145b of FIG. 2 to be induced by an electric field effect if the supply of electrons has been interrupted because the time during which a pulse voltage is applied is relatively short (e.g., less than about 20 μs).

As illustrated in FIG. 7, in case A where the memory transistors $T_M$ are not supplied with electrons, a flat band voltage V_FLAT hardly changes until a write time of about 100 μs. In case B where the memory transistors $T_M$ have been supplied with electrons, a 5V or greater difference in the flat voltage V_FLAT was observed in case B at the write time of about 100 μs as compared to case A. In case A, a source/drain region of the memory transistors $T_M$ are doped with impurities, and electrons are supplied to the source/drain region doped with the impurities.

A change in the flat band voltage V_FLAT denotes a change of a threshold voltage. A change in the threshold voltage affects whether programming is performed. It can be seen that if the ISPP technique that provides a write time of less than 20 μs is used, programming is seldom performed in case A, and programming is performed in case B.

As such, if the memory transistors $T_M$ have been supplied with electrons, programming is possible. If the memory transistors $T_M$ are not supplied with electrons, programming is prevented. As such, programming may be prevented without needing to apply a high channel boosting voltage to the memory transistors $T_M$.

In the non-volatile memory device operating method according to example embodiments, it is not necessary to perform a channel boosting technique to prevent programming. As such, problems caused in the conventional art if a high channel boosting voltage is used may be prevented. For example, damages to the outermost memory transistors $T_M$ may be prevented (or reduce), and consequently programming and writing windows may be secured and a short channel effect may be prevented (or reduced). As such, the operational reliability of the non-volatile memory device increases.

Because channel boosting is not required, the pass voltage $V_{pass}$ may not be applied to the word lines WL1 and WL0 between the selected word line WL2 and the ground selection line GSL, during programming and prevention of programming. Thus, using a non-volatile memory device operating method according to example embodiments may reduce power consumption.

Figure 8:
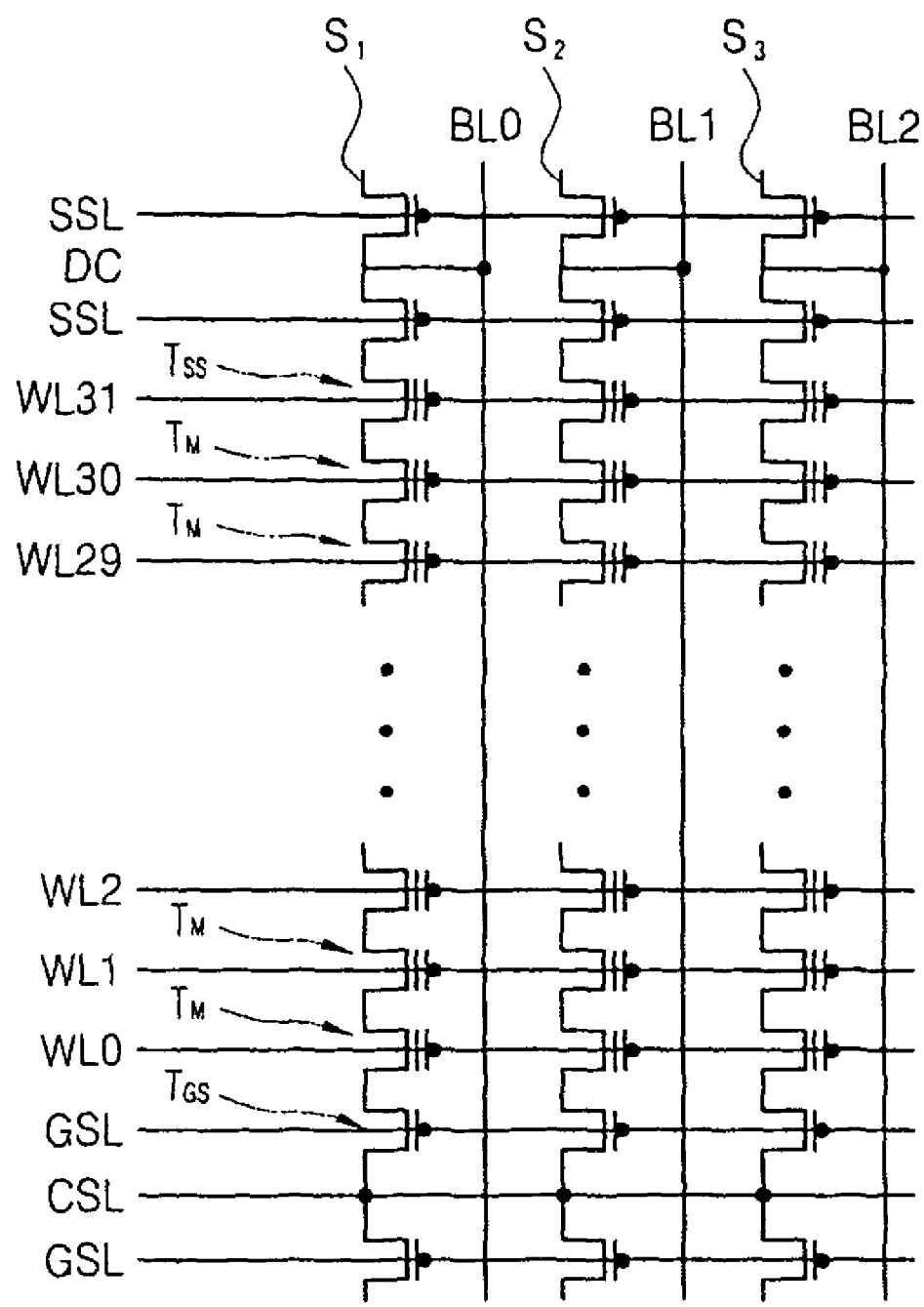

FIG. 8 is a circuit diagram of a non-volatile memory device according to example embodiments. The non-volatile memory device according to example embodiments may correspond to a NAND array structure of the non-volatile memory device of FIG. 1. Thus, a detailed description of like elements of the embodiment illustrated in FIG. 1 will be omitted for the sake of brevity.

Referring to FIG. 8, a plurality of bit lines BL0, BL1, and BL2 and a plurality of word lines WL0, WL1, WL2 . . . WL29, WL30, and WL31 may form a matrix. A plurality of memory transistors $T_M$, a plurality of string selection transistors $T_{SS}$, and a plurality of ground selection transistors $T_{GS}$ may be coupled with the bit lines BL0, BL1, and BL2 and the word lines WL0, WL1, WL2 . . . WL29, WL30, and WL31 so as to form a NAND array structure. The number of bit lines BL0, BL1, and BL2 and the number of word lines WL0, WL1, WL2 . . . WL29, WL30, and WL31 are not limited to that shown in FIG. 8, but may suitably vary according to the required capacity of the non-volatile memory device.

Each of a plurality of NAND strings S1, S2, and S3 may correspond to the NAND string S of FIG. 1. A string selection line SSL may be shared by the string selection transistors $T_{SS}$ arranged on an identical row. Each of the word lines WL0, WL1, WL2 . . . WL29, WL30, and WL31 may be shared by the memory transistors $T_M$ arranged on an identical (or same) row. The ground selection line GSL may be shared by the ground selection transistors $T_{GS}$ arranged on an identical (or same) row. The bit lines BL0, BL1, and BL2 may be connected to the NAND strings S1, S2, and S3 via contact plugs DC.

FIGS. 2 and 3 may be referred to for a plane and a cross-sectional view of the non-volatile memory device of FIG. 8, respectively. Accordingly, the bit lines BL0, BL1, and BL2 and the word lines WL0, WL1, WL2 . . . WL29, WL30, and WL31 may be arranged on the semiconductor substrate 105 of FIG. 3. The arrangement of the first source/drain regions 145a of FIG. 3 and the second source/drain regions 145b of FIG. 5 may also be applicable to the non-volatile memory device shown in FIG. 8.

Figure 9:
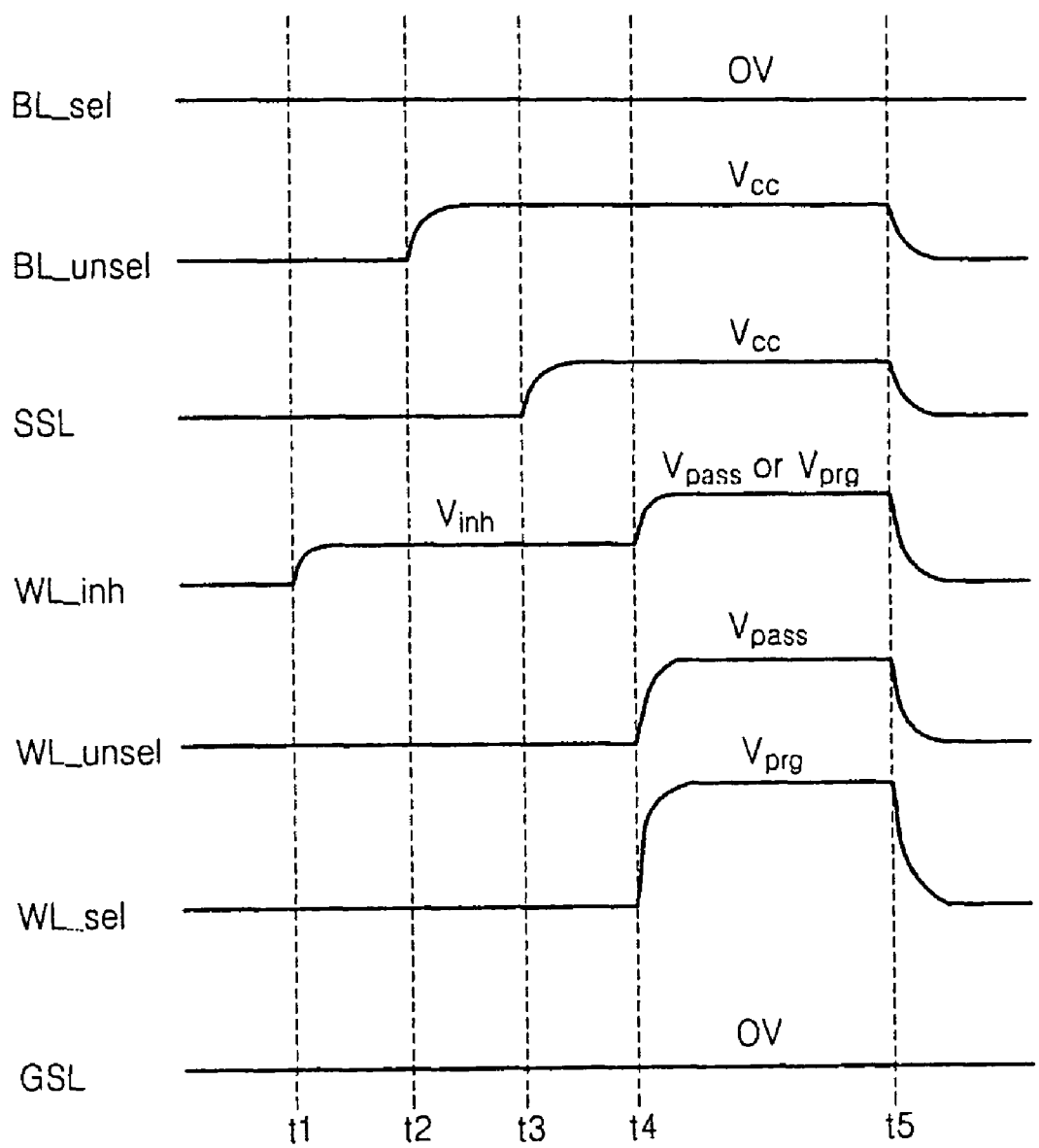

FIG. 9 is a timing diagram for describing a method of operating the non-volatile memory device of FIG. 8 according to example embodiments. Referring to FIG. 9, a selected bit line BL_sel for programming and unselected bit lines BL_unsel for preventing programming may be determined from among the bit lines BL0, BL1, and BL2. The unselected bit lines BL_unsel may correspond to bit lines other than the selected bit line BL_sel from among the bit lines BL0, BL1, and BL2. For example, if the selected bit line BL_sel is BL0, then the unselected bit lines BL_unsel may correspond to BL1 and BL2.

A selected word line WL_sel may indicate a word line coupled with the memory transistor $T_M$ for programming. The selected word line WL_sel may be selected from among the word lines WL0, WL1, WL2 . . . WL29, WL30, and WL31. A unselected word line WL_unsel may include word lines between the string selection line SSL and the selected word line WL_sel. The unselected word line WL_unsel may be selected from among the word lines WL0, WL1, WL2 . . . WL29, WL30, and WL31. For example, the unselected word line WL_unsel may include only the word lines between the string selection line SSL and the selected word line WL_sel or all word lines but the selected word line WL_sel.

An inhibiting word line WL_inh may include the word line WL31, which is closest (or nearest) to the string selection line SSL, from among the word lines WL0, WL1, WL2 . . . WL29, WL30, and WL31. For example, the inhibiting word line WL_inh may include only the word line WL31 or may further include at least one word line adjacent to the word line WL31 in addition to the word line WL31.

A voltage of 0V may be applied to the string selection line SSL and the ground selection line GSL. During a period from time t1 and time t4 (where t4>t1), the inhibiting voltage $V_{inh}$ may be applied to the inhibiting word line WL_inh. During a period from time t2 to time t5 (where t5>t2>t1), the operating voltage $V_{CC}$ may be applied to the unselected bit line BL_unsel. During a period from time t3 to time t5 (where t5>t3>t2), the operating voltage $V_{CC}$ may be applied to the string selection line SSL. During a period from time t4 to time t5 (where t5>t4>t3), the programming voltage $V_{prg}$ may be applied to the selected word line WL_sel, and the pass voltage $V_{pass}$ may be applied to the unselected word line WL_unsel. If the inhibiting word line WL_inh is identical with the selected word line WL_sel, the programming voltage $V_{prg}$ may be applied to the inhibiting word line WL_inh after the time t4. If the inhibiting word line WL_inh is different from the selected word line WL_sel, the pass voltage $V_{pass}$ may be applied to the inhibiting word line WL_inh after the time t4.

As such, electrons are supplied from the selected bit line BL_sel to the memory transistors $T_M$ connected to the selected bit line BL_sel, inducing the formation of the second source/drain regions 145b shown in FIG. 5. As such, data may be programmed within the memory transistors $T_M$ coupled with the selected word line WL_sel. The memory transistors $T_M$ coupled with the unselected bit line BL_unsel are not supplied with electrons, preventing programming as described above with reference to FIG. 7.

Figure 10:
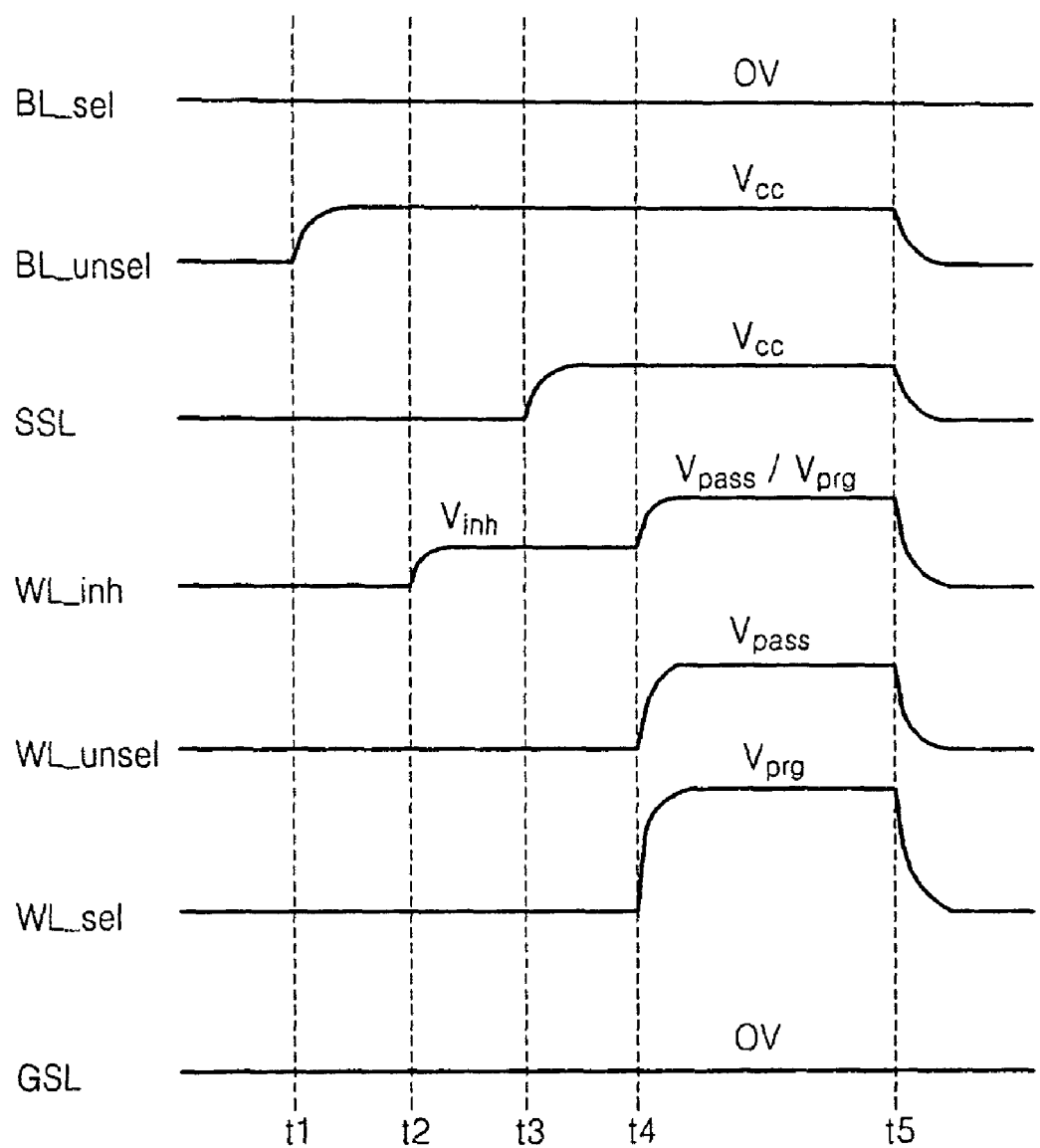

FIG. 10 is a timing diagram for describing a method of operating the non-volatile memory device of FIG. 8 according to example embodiments. The method shown in FIG. 10 is a modification of the method illustrated in FIG. 9. Therefore, a detailed description of like operations in FIG. 10 as the method illustrated in FIG. 9 will be omitted for the sake of brevity.

Referring to FIG. 10, in contrast with FIG. 9, the operating voltage $V_{CC}$ may be first applied to the unselected bit line BL_unsel, and then the inhibiting voltage $V_{inh}$ may be applied to the inhibiting word line WL_inh. For example, from time t1, the operating voltage $V_{CC}$ may be applied to the unselected bit line BL_unsel. From time t2, the inhibiting voltage $V_{inh}$ may be applied to the inhibiting word line WL_inh.

According to the methods of FIGS. 9 and 10, the application of the operating voltage $V_{CC}$ to the unselected bit line BL_unsel and the application of the inhibiting voltage $V_{inh}$ to the inhibiting word line WL_inh may be performed in an arbitrary order.

Figure 11:
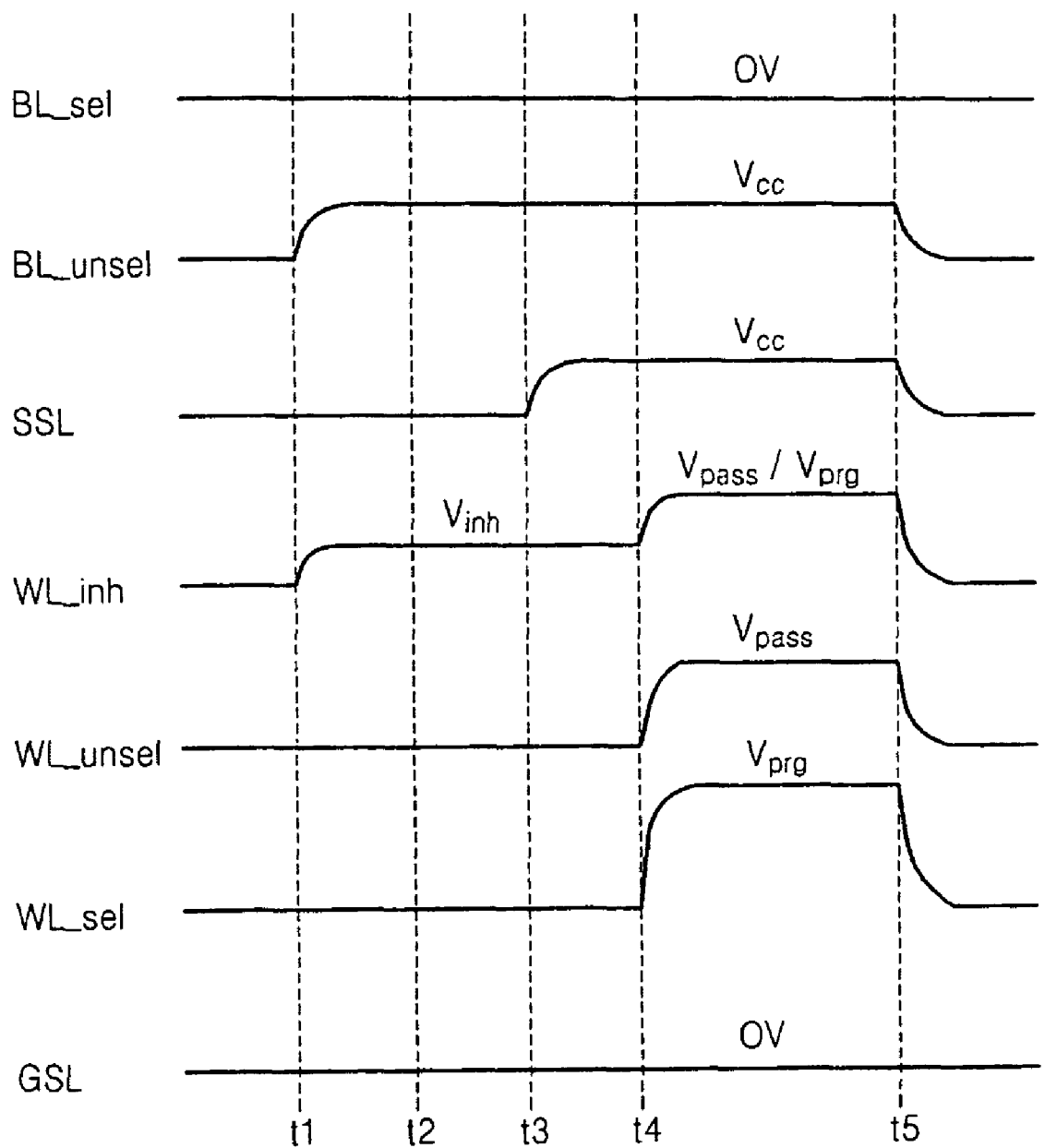

FIG. 11 is a timing diagram for describing a method of operating the non-volatile memory device of FIG. 8 according to example embodiments. The method shown in FIG. 11 is a modification of the method illustrated in FIG. 9. Therefore, a detailed description of like operations in FIG. 11 as the method illustrated in FIG. 9 will be omitted for the sake of brevity.

Referring to FIG. 11, in contrast with FIG. 9, the application of the operating voltage $V_{CC}$ to the unselected bit line BL_unsel and the application of the inhibiting voltage $V_{inh}$ to the inhibiting word line WL_inh may be performed simultaneously.

For example, from time t1, the operating voltage $V_{CC}$ may be applied to the unselected bit line BL_unsel, and simultaneously, the inhibiting voltage $V_{inh}$ may be applied to the inhibiting word line WL_inh.

Figure 12:
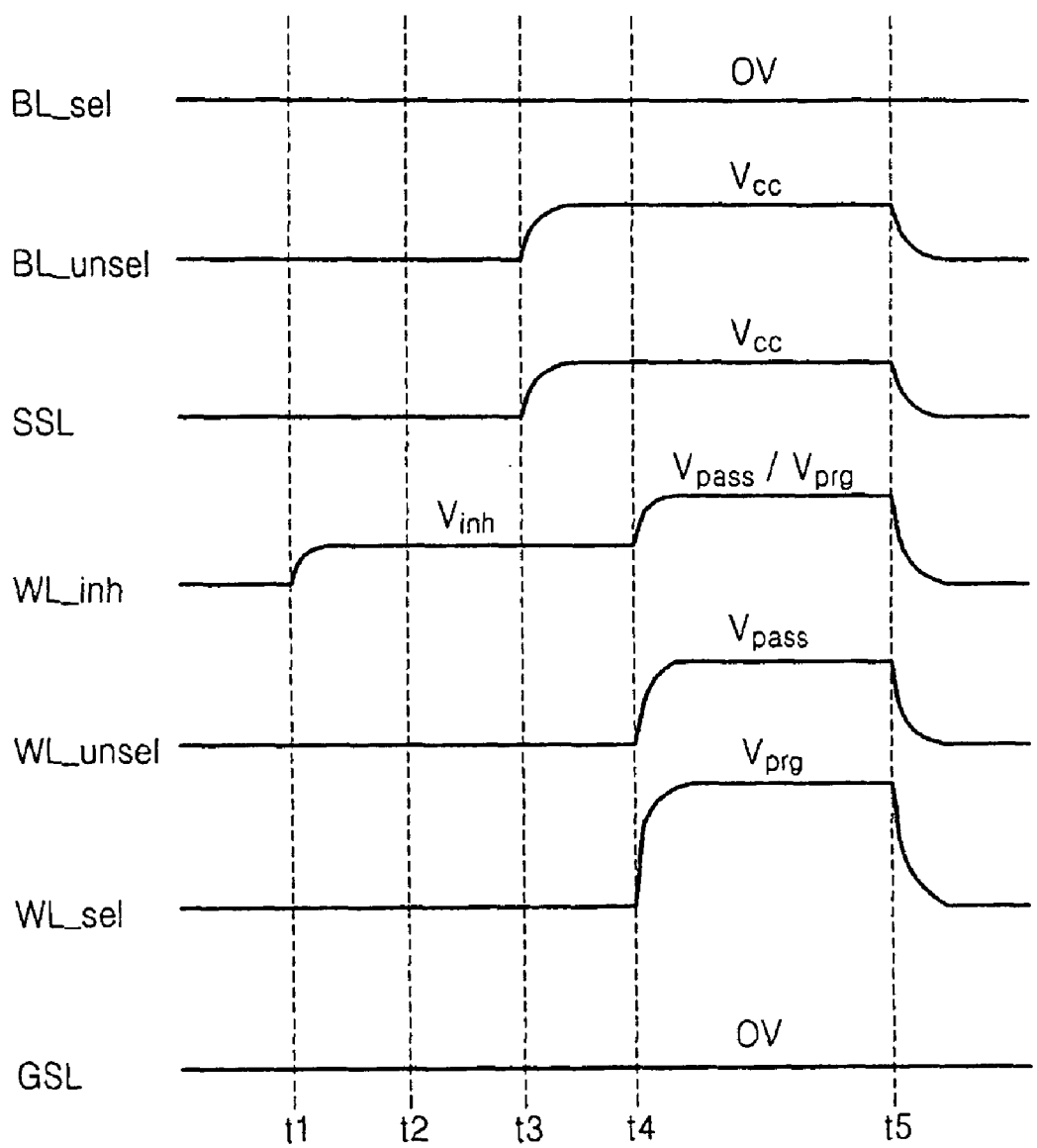

FIG. 12 is a timing diagram for describing a method of operating the non-volatile memory device of FIG. 8 according to example embodiments. The method shown in FIG. 12 is a modification of the method illustrated in FIG. 9. Therefore, a detailed description of like operations in FIG. 12 as the method illustrated in FIG. 9 will be omitted for the sake of brevity.

Referring to FIG. 12, in contrast with FIG. 9, the application of the operating voltage $V_{CC}$ to the unselected bit line BL_unsel and the application of the operating voltage $V_{CC}$ to the string selection line SSL may be performed simultaneously. For example, from time t3, the operating voltage $V_{CC}$ may be simultaneously applied to the unselected bit line BL_unsel and to the string selection line SSL.

Figure 13:
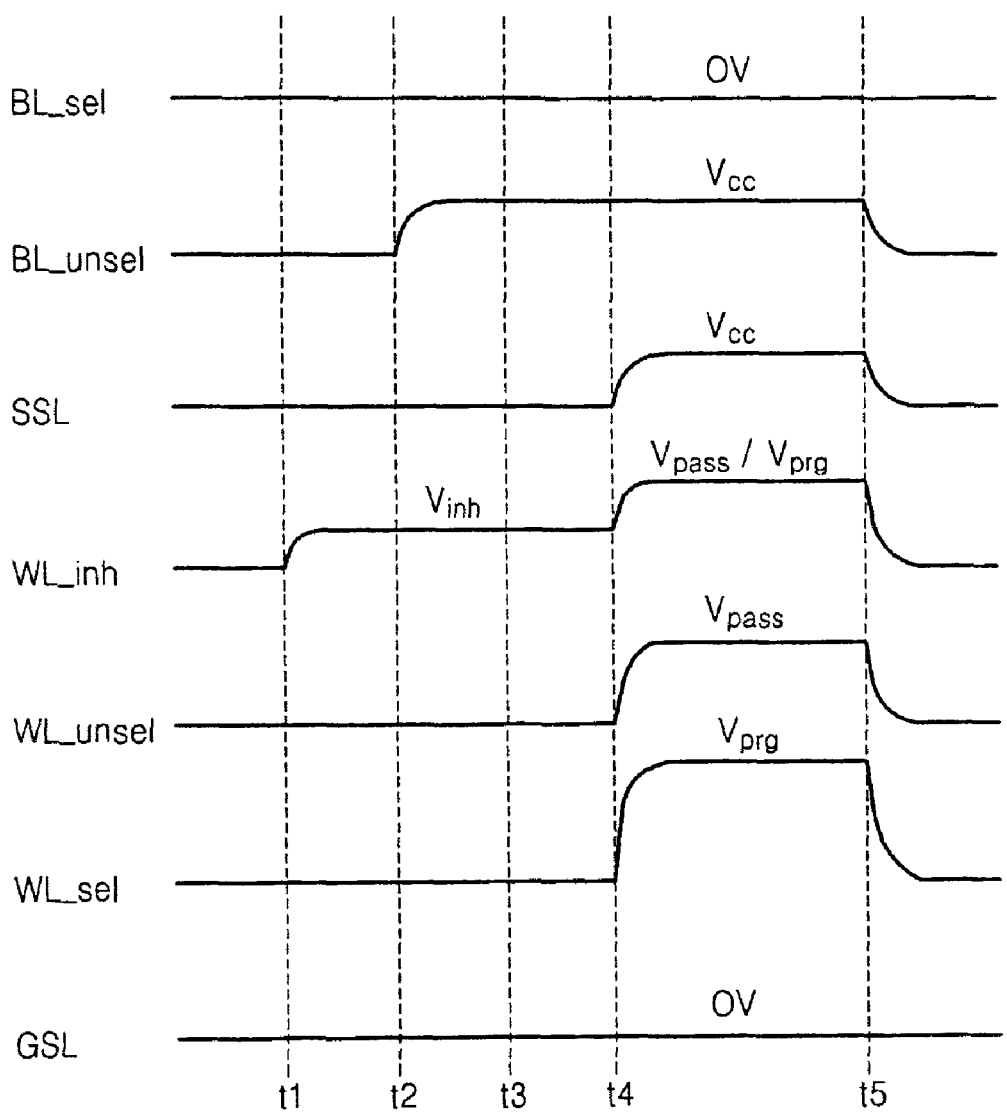

FIG. 13 is a timing diagram for describing a method of operating the non-volatile memory device of FIG. 8 according to example embodiments. The method shown in FIG. 13 is a modification of the method illustrated in FIG. 9. Therefore, a detailed description of like operations in FIG. 13 as the method illustrated in FIG. 9 will be omitted for the sake of brevity.

Referring to FIG. 13, in contrast with FIG. 9, the application of the operating voltage $V_{CC}$ to the string selection line SSL and the application of the programming voltage $V_{prg}$ or the pass voltage $V_{pass}$ to the inhibiting word line WL_inh may be performed simultaneously. For example, from time t4, the operating voltage $V_{CC}$ may be applied to the string selection line SSL, and simultaneously, the programming voltage $V_{prg}$ or the pass voltage $V_{pass}$ may be applied to the inhibiting word line WL_inh.

Figure 14:
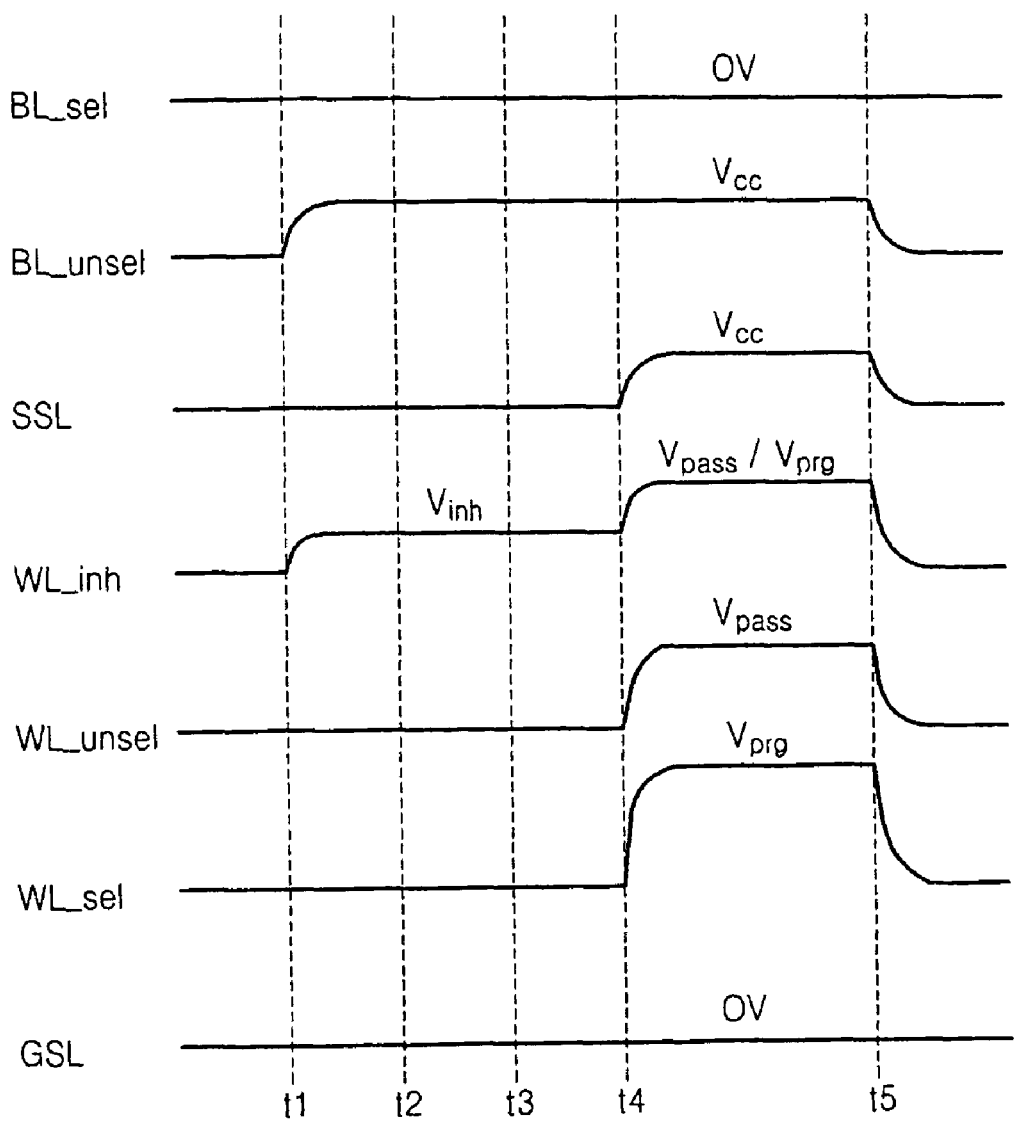

FIG. 14 is a timing diagram for describing a method of operating the non-volatile memory device of FIG. 8 according to example embodiments. The method shown in FIG. 14 is a modification of the method illustrated in FIG. 9. Therefore, a detailed description of like operations in FIG. 14 as the method illustrated in FIG. 9 will be omitted for the sake of brevity.

Referring to FIG. 14, in contrast with FIG. 9, the application of the operating voltage $V_{CC}$ to the unselected bit line BL_unsel and the application of the inhibiting voltage $V_{inh}$ to the inhibiting word line WL_inh may be performed simultaneously. The application of the operating voltage $V_{CC}$ to the string selection line SSL and the application of the programming voltage $V_{prg}$ or the pass voltage $V_{pass}$ to the inhibiting word line WL_inh may be performed simultaneously. For example, from time t1, the operating voltage $V_{CC}$ may be applied to the unselected bit line BL_unsel, and the inhibiting voltage $V_{inh}$ may be simultaneously applied to the inhibiting word line WL_inh. Also, from time t4, the operating voltage $V_{CC}$ may be applied to the string selection line SSL, and the programming voltage $V_{prg}$ or the pass voltage $V_{pass}$ may be simultaneously applied to the inhibiting word line WL_inh.

Figure 15:
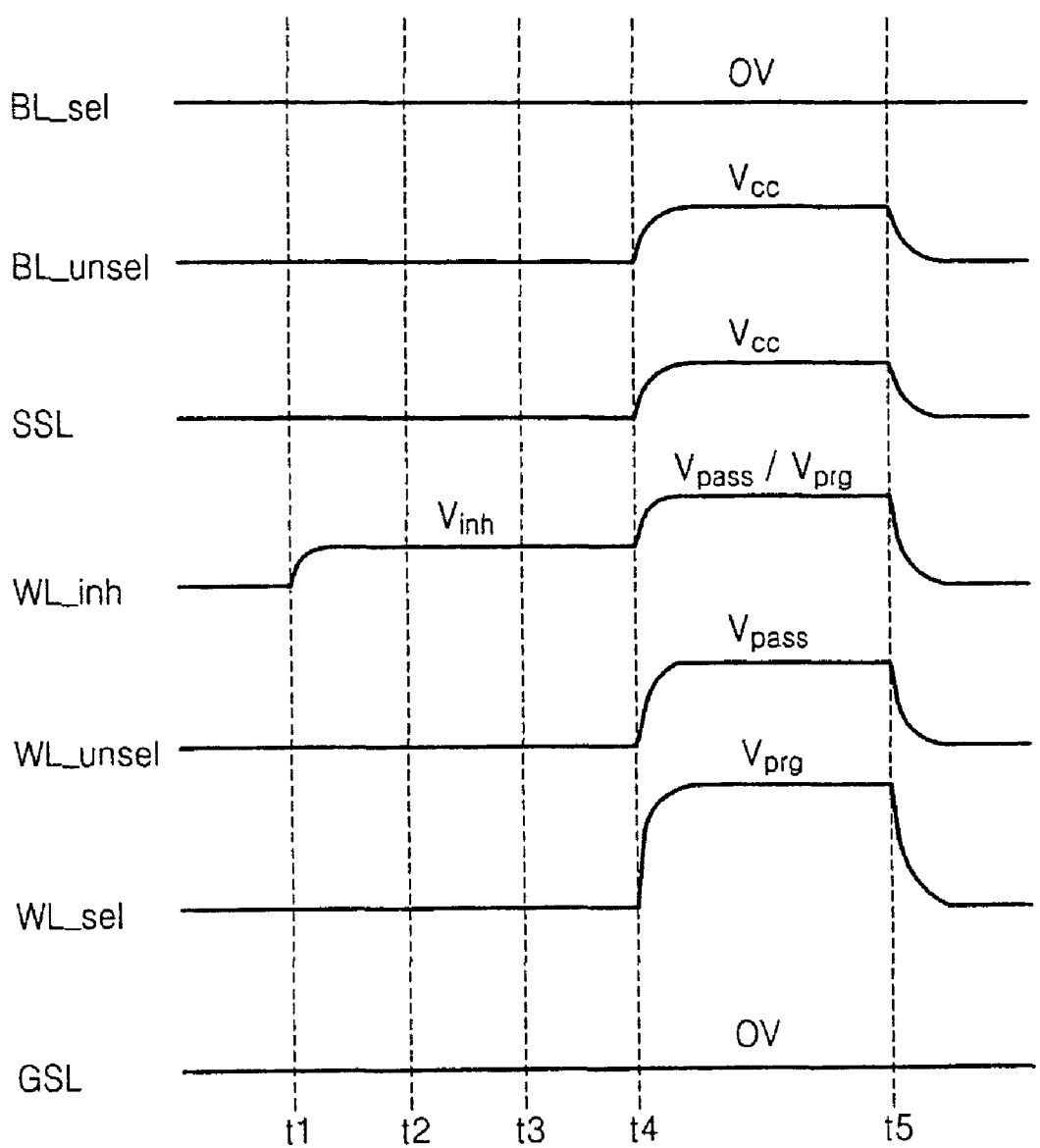

FIG. 15 is a timing diagram for describing a method of operating the non-volatile memory device of FIG. 8 according to example embodiments. The method shown in FIG. 15 is a modification of the method illustrated in FIG. 9. Therefore, a detailed description of like operations in FIG. 15 as the method illustrated in FIG. 9 will be omitted for the sake of brevity.

Referring to FIG. 15, in contrast with FIG. 9, the application of the operating voltage $V_{CC}$ to the unselected bit line BL_unsel, the application of the operating voltage $V_{CC}$ to the string selection line SSL, and the application of the programming voltage $V_{prg}$ or the pass voltage $V_{pass}$ to the inhibiting word line WL_inh may be performed simultaneously. For example, from time t4, the operating voltage $V_{CC}$ may be simultaneously applied to the unselected bit line BL_unsel and the string selection line SSL, and the programming voltage $V_{prg}$ or the pass voltage $V_{pass}$ may be simultaneously applied to the inhibiting word line WL_inh.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of operating a NAND-type non-volatile memory device, the NAND-type non-volatile memory device having a plurality of memory transistors coupled with a plurality of bit lines and a plurality of word lines, the method comprising:

determining a selected bit line for programming and unselected bit lines for preventing programming from the plurality of bit lines;

applying an inhibiting voltage to at least one inhibiting word line chosen from the plurality of word lines, wherein the at least one inhibiting word line includes a first word line positioned nearest to a string selection line; and applying a programming voltage to a selected word line chosen from the plurality of word lines such that data is programmed into a memory transistor coupled with the selected word line and the selected bit line while preventing data from being programming into memory transistors coupled with the unselected bit lines, wherein the memory transistor coupled with the selected word line and the selected bit line and the memory transistors coupled with the unselected bit lines are chosen from the plurality of transistors.

2. The method of claim 1, further comprising applying an operating voltage that is less than, or equal to, the inhibiting voltage to the string selection line if the inhibiting voltage has been applied to the at least one inhibiting word line.

3. The method of claim 2, wherein applying the operating voltage to the string selection line and applying the programming voltage to the selected word line are performed simultaneously.

4. The method of claim 2, wherein applying the operating voltage to the string selection line is performed prior to applying the programming voltage to the selected word line.

5. The method of claim 2, further comprising applying the operating voltage to the unselected bit lines simultaneously or after applying the inhibiting voltage to the at least one inhibiting word line.

6. The method of claim 5, wherein applying the operating voltage to the unselected bit lines and applying the operating voltage to the string selection line are simultaneously performed.

7. The method of claim 5, wherein applying the operating voltage to the unselected bit lines, applying the operating voltage to the string selection line, and applying the programming voltage to the selected word line are simultaneously performed.

8. The method of claim 5, wherein applying the inhibiting voltage to the at least one inhibiting word line, applying the operating voltage to the unselected bit lines, applying the operating voltage to the string selection line are sequentially performed.

9. The method of claim 1, further comprising applying 0V to the selected bit line prior to applying the programming voltage to the selected word line.

10. The method of claim 1, further comprising applying a pass voltage to unselected word lines having a desired number of word lines between the string selection line and the selected word line simultaneously with applying the programming voltage to the selected word line, wherein the unselected word lines are chosen from the plurality of word lines.

11. The method of claim 10, wherein the unselected word lines include only the desired number of word lines between the string selection line and the selected word line.

12. The method of claim 10, wherein the unselected word lines include all of the plurality of word lines except the selected word line.

13. The method of claim 2, wherein the at least one inhibiting word line is the selected word line; and
the inhibiting voltage and the programming voltage are sequentially applied to the selected word line.

14. The method of claim 2, further comprising applying a pass voltage to the at least one inhibiting word line, after the inhibiting voltage is applied to the at least one inhibiting word line, wherein the at least one inhibiting word line is different from the selected word line.

15. The method of claim 1, further comprising applying 0V to a ground selection line facing the string selection line prior to applying the programming voltage to the selected word line, wherein the plurality of word lines are interposed between the ground selection line and the string selection line.

16. The method of claim 1, wherein at least two of the plurality of memory transistors are coupled with the selected bit line, the memory transistors coupled with the selected bit line being electrically connected to one another by an electrical field effect source/drain induced by a fringe field during the programming.

17. The method of claim 1, wherein the at least one inhibiting word line includes a second word line adjacent to the first word.

18. A method of operating a NAND-type non-volatile memory device, the NAND-type non-volatile memory device having a plurality of memory transistors coupled with a plurality of bit lines and a plurality of word lines, the method comprising:

determining a selected bit line for programming and unselected bit lines for preventing programming from the plurality of bit lines;

applying 0V to a string selection line and a ground selection line disposed on opposite sides of the plurality of word lines;

applying an inhibiting voltage to an inhibiting word line chosen from the plurality of word lines, wherein the inhibiting word line includes a word line closest to the string selection line;

applying an operating voltage to the string selection line and the unselected bit lines, wherein the operating voltage is less than, or equal to, the inhibiting voltage; and applying a programming voltage to a selected word line from among the plurality of word lines; and applying a pass voltage to unselected word lines chosen from the plurality of word lines excluding the selected word line, wherein the unselected word lines include a desired number of word lines positioned between the string selection line and the selected word line.

19. The method of claim 18, wherein the operating voltage is applied to the string selection line simultaneously or after applying the inhibiting voltage to the inhibiting word line.

20. The method of claim 18, wherein the programming voltage and the pass voltage are applied in the form of pulses.

* * * * *